United States Patent [19]
Nauta et al.

[11] Patent Number: 6,084,473
[45] Date of Patent: Jul. 4, 2000

[54] MULTIPOINT CONTROLLED HIGH DYNAMIC RANGE VARIABLE GAIN AMPLIFIER

[75] Inventors: Henk C. Nauta, Nootdorp; Frank A. A. Verwaal, Nieuwerkerk/Yssel, both of Netherlands

[73] Assignee: Maxim Integrated Products, Inc., Sunnyvale, Calif.

[21] Appl. No.: 09/222,050

[22] Filed: Dec. 29, 1998

[51] Int. Cl.[7] ........................................................ H03F 3/45
[52] U.S. Cl. .......................... 330/254; 330/310; 327/359
[58] Field of Search .................................... 330/254, 310, 330/98, 99, 100, 133; 327/359, 361, 561, 563

[56] References Cited

U.S. PATENT DOCUMENTS

| | | | |
|---|---|---|---|
| 3,707,685 | 12/1972 | Geffe | 330/21 |
| 3,863,173 | 1/1975 | Scheib et al. | 330/98 |
| 4,074,204 | 2/1978 | Broburg et al. | 330/109 |
| 4,185,249 | 1/1980 | McKim, Jr. et al. | 330/85 |
| 4,521,702 | 6/1985 | Kleinberg | 307/520 |
| 5,113,144 | 5/1992 | Song | 330/85 |

*Primary Examiner*—Robert Pascal
*Assistant Examiner*—Henry Choe
*Attorney, Agent, or Firm*—Blakely, Sokoloff, Taylor & Zafman LLP

[57] ABSTRACT

Variable gain amplifiers comprised of multiple variable gain stages, wherein the gain of the various stages is controlled by comparisons of a control voltage with various reference voltages, in the preferred embodiment generated by the use of a series connection of multiple resistors connected to a supply voltage. These relative comparisons control current ratios determining the gain of each variable gain amplifier stage. By staggering the changes in current ratios, an overall gain change with control voltage which is smooth in gain in dB versus control voltage in volts may be achieved, generally without requiring use of current sources which are proportional to absolute temperature. The sequence of control of the individual gain states as a function of the control voltage in the preferred embodiment is selected such that the best performance is obtained with respect to noise, signal handling capability and distortion at every setting of the total gain. This implies, that as a function of a decreasing control voltage (or as a function of a decreasing total VGA gain from a maximum gain), first the last amplifier VGA2 is controlled to lower gain values, whereafter the middle amplifier VGA3 is controlled to lower gain values, whereafter the input amplifier VGA1 is controlled to lower gain values, whereafter the last amplifier VGA2 is controlled again to still lower gain values.

9 Claims, 11 Drawing Sheets

VGA2

GAIN COMP VGA2 LOOP GAIN

GAIN COMP VGA1B CDMA

GAIN COMP VGA3

MULTIPOINT CONTROLLED HIGH DYNAMIC RANGE VARIABLE GAIN AMPLIFIER

BACKGROUND OF THE INVENTION

1. Field of the Invention

The present invention relates to the field of variable gain amplifiers.

2. Prior Art

Various types of variable gain amplifiers are well known in the prior art. Such amplifiers are frequently used for amplifying signals of varying signal strength to provide an output signal of a predetermined signal strength for direct use or for further signal processing in the system. Of particular importance for such applications is the range of gain available, and the noise added to the signal by the variable gain amplifier. Since each stage amplifies the noise imposed by the prior stages as well as the signal, it is particularly important that the variable gain amplifier have a low noise input stage commensurate with the overall gain of the amplifier, as merely increasing the gain range of a variable gain amplifier without a corresponding control of the noise of the amplifier will only provide an output for the highest gains dominated by the noise of the input stage of the amplifier.

Also important in many applications is the controllability of the gain of a variable gain amplifier. In the least demanding applications, a reasonably well behaved, monatonic variation in gain with gain control voltage is adequate. In the more demanding applications however, a predefined variation of gain with gain control voltage, repeatable over the operating temperature range of the variable gain amplifier, such as a log-linear variation, is a necessity. The preferred embodiment of the present invention provides a variable amplifier having low noise, a wide variable gain range and a predefined, stable over temperature, gain variation over the full range of gain control and temperature variations.

BRIEF SUMMARY OF THE INVENTION

Disclosed herein is a variable gain amplifier comprised of multiple variable gain stages, wherein the gain of the various stages is controlled by comparisons of a control voltage with various reference voltages, in the preferred embodiment generated by the use of a series connection of multiple resistors connected to a supply voltage. These relative comparisons control current ratios, determining the gain of each variable gain amplifier stage. By staggering the changes in current ratios, an overall gain change with control voltage which is a smooth in gain in dB versus control voltage in volts may be achieved, generally without requiring use of current sources which are proportional to absolute temperature.

The sequence of control of the individual gain states as a function of the control voltage in the preferred embodiment is selected such that the best performance is obtained with respect to noise, signal handling capability and distortion at every setting of the total gain. This implies, that as a function of a decreasing control voltage (or as a function of a decreasing total VGA gain from a maximum gain), first the last amplifier VGA2 is controlled to lower gain values, whereafter the middle amplifier VGA3 is controlled to lower gain values, whereafter the input amplifier VGA1 is controlled to lower gain values, whereafter the last amplifier VGA2 is controlled again to still lower gain values.

Other aspects and features are disclosed.

DETAILED DESCRIPTION OF THE INVENTION

Figure 1:
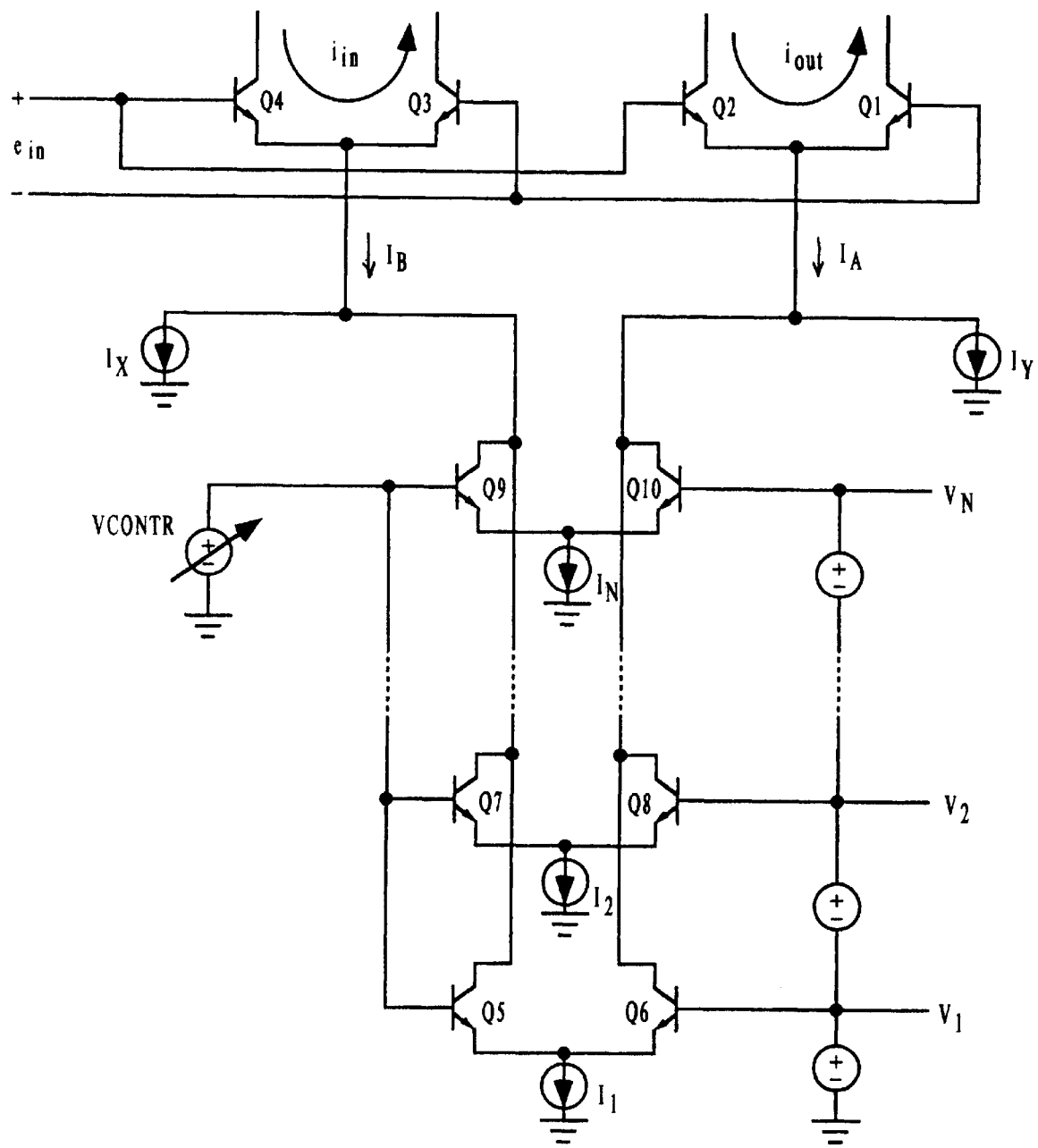
FIG. 1 is a partial circuit illustrating one aspect of the exemplary embodiment of the present invention described herein.

First referring to FIG. 1, a partial circuit illustrating one aspect of the present invention may be seen. In the specific embodiment to be described, the transistors are npn bipolar transistors, though of course the principles of the invention may be practiced with other types of transistors. Shown in FIG. 1 is a first differential pair consisting of transistors Q1 and Q2, and a second differential pair consisting of transistors Q3 and Q4. The differential pair of transistors Q1 and Q2 operate on a tail current $I_A$, whereas the differential transistor pair Q3 and Q4 operate with a tail current $I_B$. The loop amplifiers which force the differential input currents (signal currents) to flow into the collectors of Q1 and Q2, and the load devices to the collectors of transistors Q3 and Q4, are not shown in FIG. 1, though the differential collector currents for transistors Q3 and Q4 due to the differential input voltage to the bases thereof is shown as $i_{in}$, and the differential collector currents for transistors Q1 and Q2 due to the differential input thereto is shown as $i_{out}$. The differential input current $i_{in}$ to the first differential pair is forced (by using negative feedback) to be proportional to the input signal. The differential pair Q1,Q2, is driven by the same input voltage as the differential pair Q3,Q4 and consequently its differential output current $i_{out}$ will also be proportional to the input signal. Also shown in FIG. 1 are differential transistor pairs Q5 and Q6, Q7 and Q8, and Q9 and Q10. In general, the two transistors in each transistor pair will be non-identical transistors, though all transistors in such transistor pairs may be identical transistors for convenience.

In the circuit shown in FIG. 1, the transistor pairs Q5 and Q6, Q7 and Q8, and Q9 and Q10 each operate as a differential pair responding to the difference in voltage between the variable gain control voltage VCONTR and a reference voltage applied to the second transistor of the differential pair. These reference voltages, $V_1$, $V_2$, etc. in the preferred embodiment are provided by a series connection of resistors driven by a single reference voltage. When the gain control voltage VCONTRL is much lower than the reference voltage VI, transistors Q5, Q7 and Q9 (and whatever corresponding transistors there are there between) are all turned off and transistors Q6, Q8 and Q10 (and any corresponding transistors there between) are in turn all turned on. Under this condition, the current sources $I_1$ through $I_N$ and the current source $I_y$ are all connected to provide the tail current $I_A$ for transistors Q1 and Q2. The tail current $I_B$ for transistors Q3 and Q4, however, is simply $I_x$.

When the gain control voltage VCONTRL equals the reference voltage $V_1$, transistors Q5 and Q6 turn on equally, so that one-half of the current from current source $I_1$, flows through each of the two transistors. Thus, $I_B$ increases by an amount equal to $I_1/2$ and $I_A$ decreases by $I_1/2$. When the gain control voltage VCONTRL increases so as to equal a voltage equal to $V_2$, transistor Q5 will turn on harder and transistor Q6 will substantially turn off, so that all of current $I_1$ will now be included in the tail current $I_B$. Also, under this condition transistors Q7 and Q8 will conduct equally so that half of the current $I_2$ will contribute to the tail current $I_A$ for transistors Q1 and Q2 and half the current $I_2$ will contribute to the tail current $I_B$ for transistors Q3 and Q4. Ultimately, of course, if the gain control voltage VCONTRL significantly exceeds the voltage of $V_N$, all of the current of the current sources $I_1$ through $I_N$ will be coupled to add to the tail current $I_B$ of transistors Q3 and Q4. These various tail currents, $I_A$ and $I_B$, for the various specific values of the gain control voltage VCONTRL are summarized in the table below.

| $V_{gain}$ | $I_A$ | $I_B$ |
|---|---|---|
| $\ll V_1$ | $I_y + \sum_{1}^{N} I_n$ | $I_x$ |
| $= V_1$ | $I_y + \dfrac{I_1}{2} + \sum_{2}^{N} I_n$ | $I_x + \dfrac{I_1}{2}$ |
| $= V_2$ | $I_y + \dfrac{I_2}{2} + \sum_{3}^{N} I_n$ | $I_x + I_1 + \dfrac{I_2}{2}$ |
| $= V_n$ ($1 < n < N$) | $I_y + \dfrac{I_n}{2} + \sum_{n+1}^{N} I_n$ | $I_y + \sum_{1}^{n-1} I_n + \dfrac{I_n}{2}$ |
| $\gg V_N$ | $I_y$ | $I_x + \sum_{1}^{N} I_n$ |

The foregoing table is approximate only, depending upon the size of the individual reference voltage steps between the voltages $V_1$, $V_2$, etc. In the preferred embodiment of the present invention, these steps are on the order of tens of millivolts so that, by way of example, as the gain control voltage VCONTRL is slowly increased from a voltage equal to voltage $V_1$ to a voltage equal to $V_2$, transistor Q7 will begin to turn on and transistor Q8 will begin to turn off before transistors Q5 is fully turned on and transistor Q6 is fully turned off. In this manner, the variation in the tail currents $I_A$ and $I_B$ with changes in the gain control voltage VCONTRL may be made to be smooth between the fixed reference voltages $V_1$, $V_2$, etc., as desired. Further, it should be noted that provided it is the ratio of the tail currents $I_A$ and $I_B$, and not the absolute value of either which is important, the various current sources $I_x$, $I_y$, $I_1$, $I_2$, etc. need not be current sources which are proportional to absolute temperature, as the ratio of the tail currents $I_A$ and $I_B$ at any temperature is simply dependent upon the value of the gain control voltage VCONTRL in comparison to the reference voltages $V_1$, $V_2$, etc. Of course the shape of the curve representing the ratio of the tail currents $I_A$ and $I_B$ with the gain control voltage VCONTRL may be adjusted by varying the number and amount of the reference voltages $V_1$, $V_2$, etc.

Figure 2:
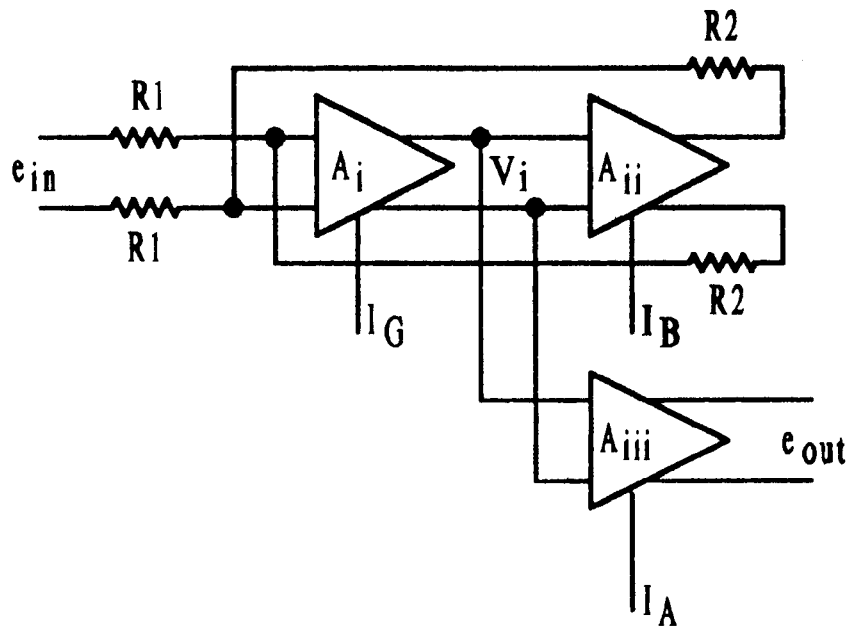
FIG. 2 illustrates a particular connection of three differential amplifiers used in the present invention.

Now consider the characteristics of three differential amplifiers connected as shown in FIG. 2. It is well known that the transconductance of a differential pair of transistors is proportional to the tail current of the differential pair divided by absolute temperature. In FIG. 2, amplifiers $A_{ii}$ and $A_{iii}$ are differential transistor pairs, each having as its input, the output $V_i$ of amplifier $A_i$. The output of amplifier $A_{ii}$ will be equal to $e_{in}*R_2/R_1$. The output of amplifier $A_i$ will be equal to the output of amplifier $A_{ii}$ divided by the gain $g_{ii}$ of amplifier $A_{ii}$, or $(e_{in}*R_2/R_1)*1/g_{ii}$. The output $e_{out}$ of amplifier $A_{iii}$ will be equal to the output of amplifier $A_i$ times the gain $g_{iii}$ of amplifier $A_{iii}$. Thus the output $e_{out}$ of amplifier $A_{iii}$ will be $(e_{in}*R_2/R_1)*g_{iii}/g_{ii}$. The overall gain g for the combination of the three differential amplifiers is:

$$g = e_{out}/e_{in} = R_2/R_1 * g_{iii}/g_{ii}$$

But the gain of each differential amplifier is proportional to the tail current for the differential pair divided by absolute temperature, so that the gains $g_{ii}$ and $g_{iii}$ may be expressed as $k_{ii}*I_B/T$ and $k_{iii}*I_A/T$, respectively. Now the gain of the combination of the three amplifiers may be expressed as:

$$g = R_2/R_1 * k_{iii}/k_{ii} * I_A/I_B$$

Thus the gain of the combination is independent of temperature without using current sources proportional to absolute temperature, and is solely dependent on a current ratio. Amplifier $A_i$ forms the loop amplifier and preferably must have a high gain in order to make the input current to amplifier $A_{ii}$ nearly equal to the input current $e_{in}/2R_1$ (FIG. 2) flowing into the resistors R1. (In which case the differential input directly across the input terminals of the amplifier $A_{ii}$ is near zero.) The worst condition in this respect occurs when the gain of amplifier $A_{ii}$ is at its lowest and the temperature is at its highest. However, as long as the gain of amplifier $A_i$ remains sufficiently high at all times, its gain can change with temperature without effect. Therefore its tail current need not be proportional to absolute temperature. It can be made dependent on the gain of amplifier $A_{ii}$, however, preferably approximately inversely proportional thereto, to maintain the product of the gains of the two amplifiers approximately constant for loop gain control purposes, that is, more constant than would occur if the gain of amplifier $A_i$ was constant.

Figure 3:
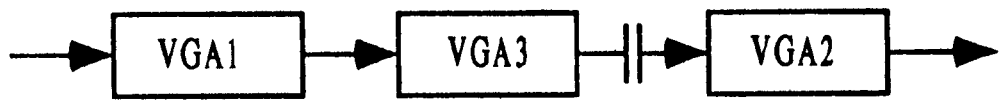
FIG. 3 is a simple block diagram illustrating the series connection of variable gain amplifiers of the exemplary embodiment described in detail herein.

Now referring to FIG. 3, a simple block diagram illustrating the series connection of variable gain amplifiers to be described in detail herein may be seen. As shown therein, the first amplifier of the series is identified as variable gain amplifier VGA1, the second amplifier in the series connection is identified as variable gain amplifier VGA3 and the third amplifier of the series is identified as variable gain amplifier VGA2. However, as shall subsequently be seen, each of these variable gain amplifiers, in effect, comprises a plurality of amplifiers relatable to the amplifier connection of amplifiers $A_i$, $A_{ii}$ and $A_{iii}$ of FIG. 2.

Figure 4:
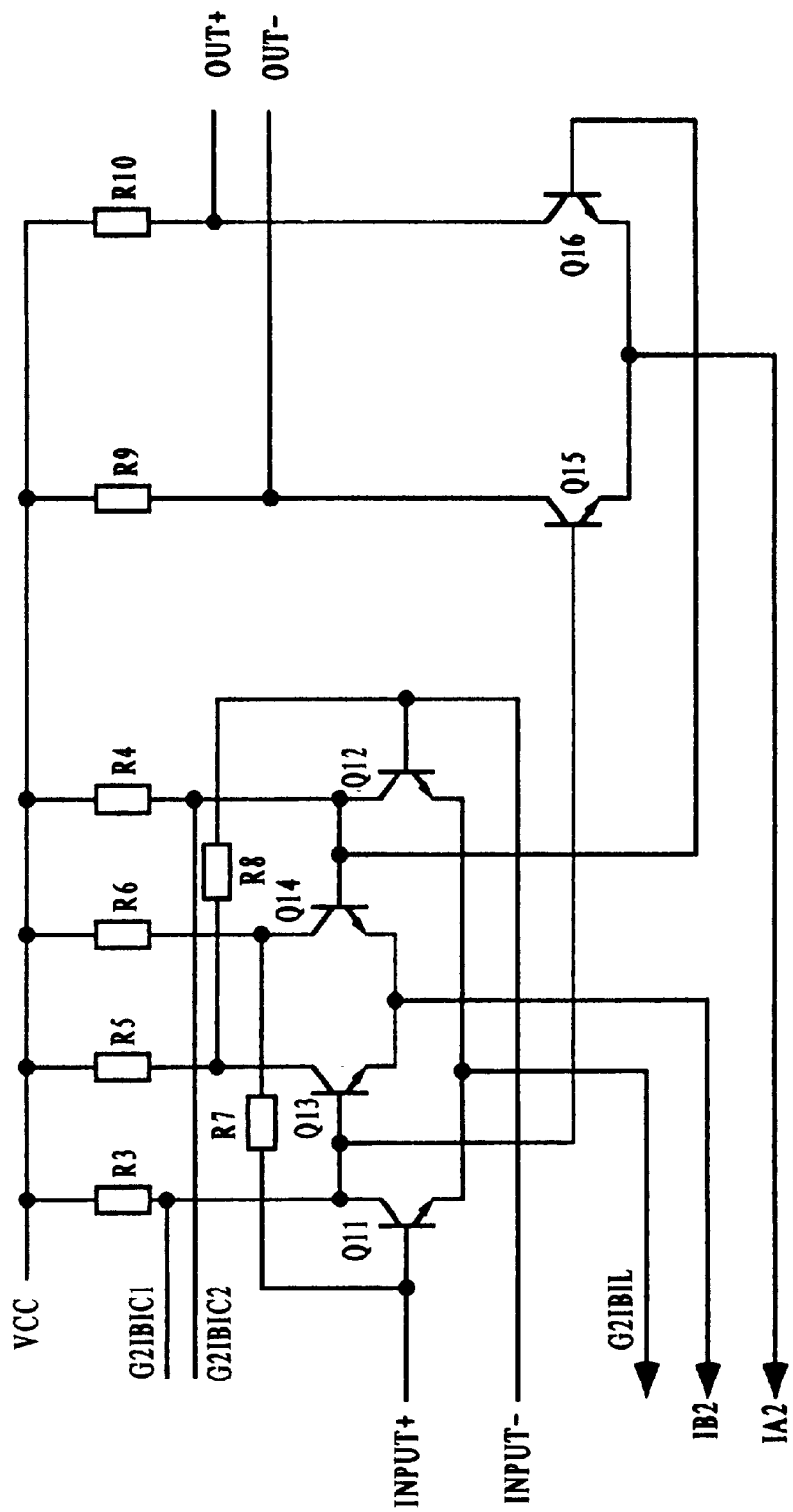
FIG. 4 is a circuit diagram for the exemplary variable gain amplifier VGA2 of FIG. 3.
Figure 5:
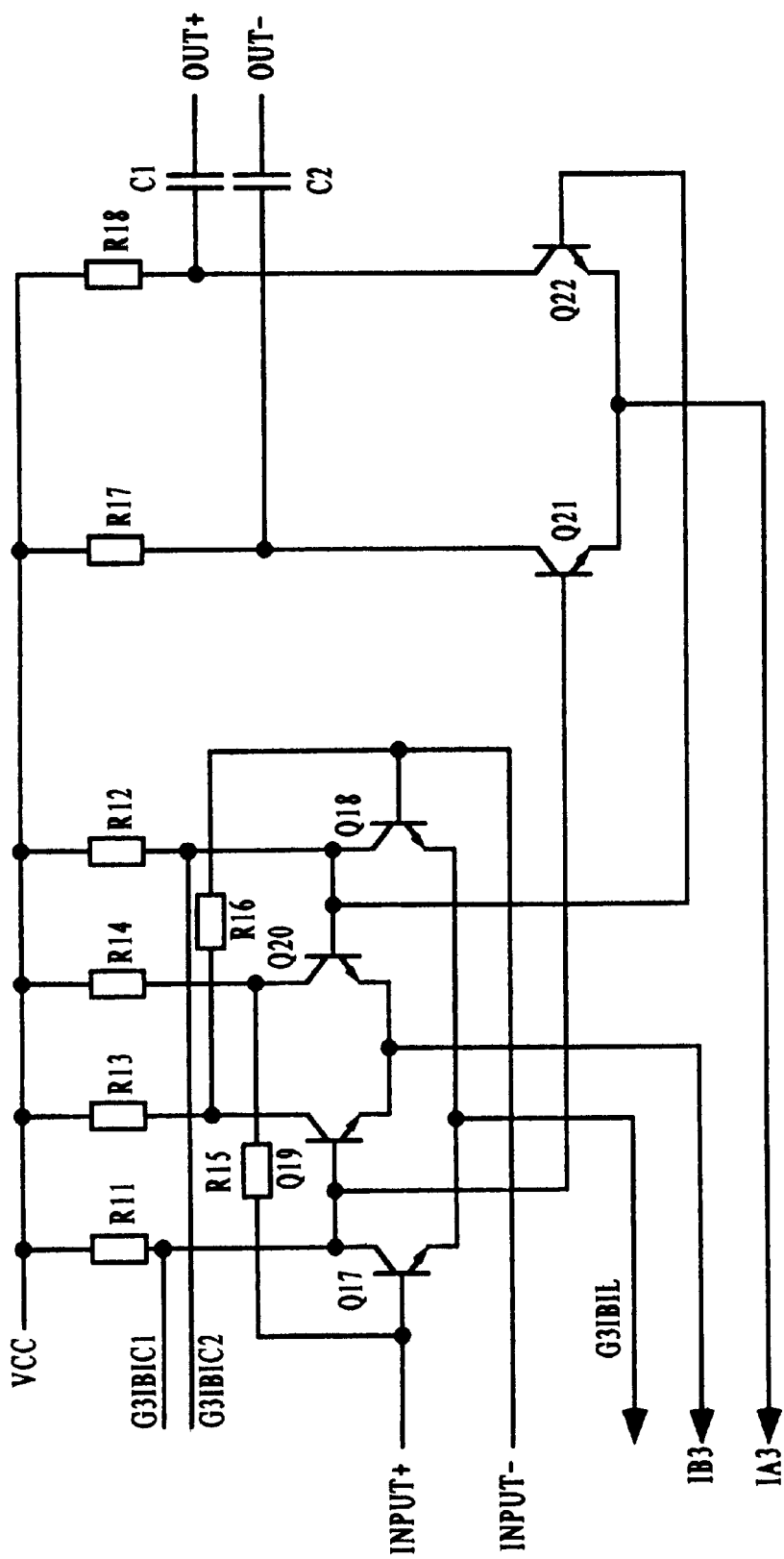
FIG. 5 is a circuit diagram for the exemplary variable gain amplifier VGA3 of FIG. 3.
Figure 6:
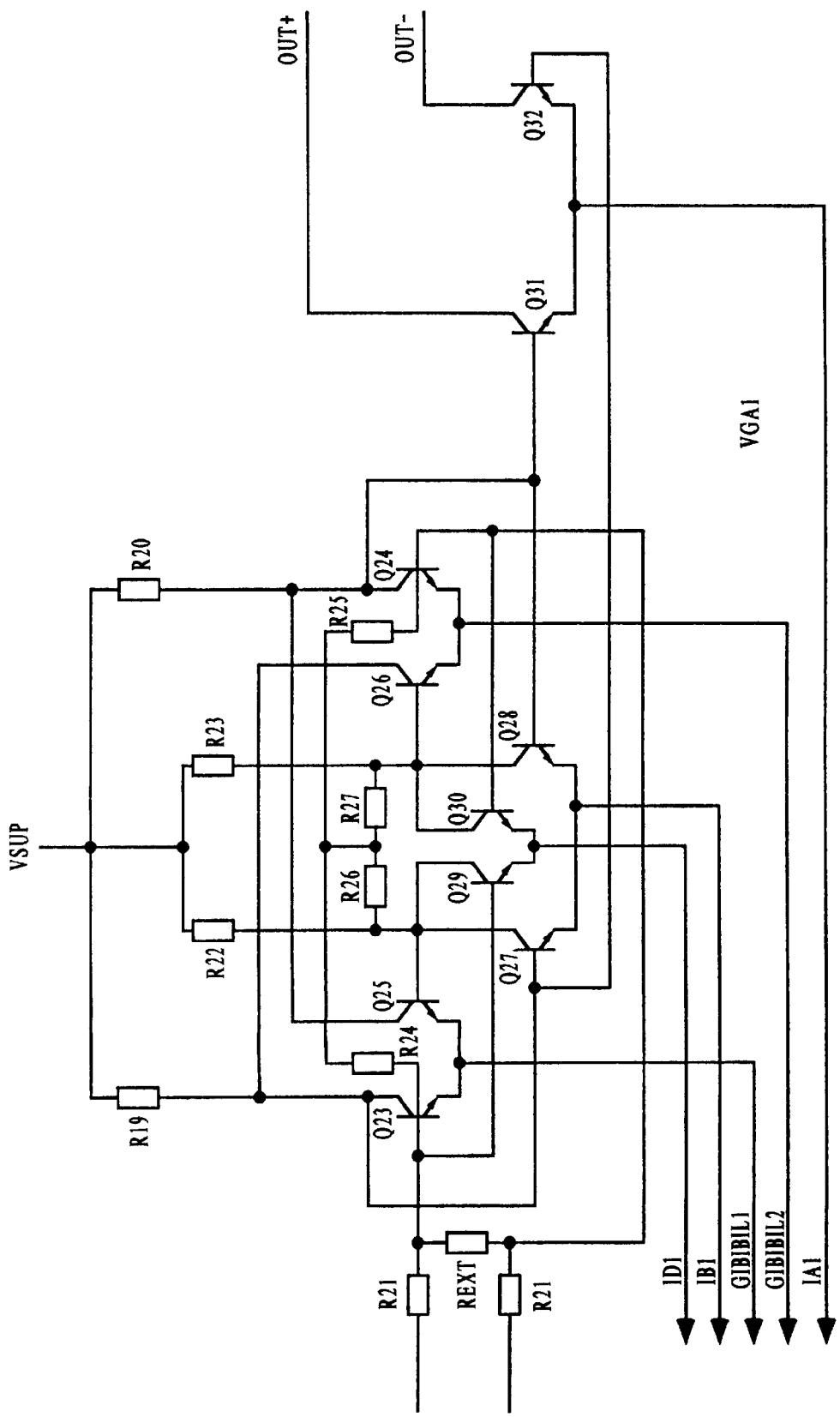
FIG. 6 is a circuit diagram for the exemplary variable gain amplifier VGA1 of FIG. 3.

Now referring to FIG. 4, a circuit diagram for the variable gain amplifier VGA2 may be seen. In this Figure, and in FIGS. 5 and 6 showing the circuits for variable gain amplifiers VGA3 and VGA1, respectively, the tail current lines for each differential pair are illustrated with an arrowhead thereon, both to distinguish from differential input and output lines, and to better keep in mind that the same are supplied by current sources which are in fact current sinks. In that regard, the phrase "current source" will be used generically herein, though most if not all of the current sources referred to in the embodiment disclosed sink current.

Referring again to FIG. 4, transistors Q11 and Q12, together with load resistors R3 and R4, are provided with a tail current source G2IBIL and form the equivalent of amplifier $A_i$ of FIG. 2. The output of that differential amplifier is directly applied to a second differential amplifier comprising transistors Q13 and Q14 and load resistors R5 and R6, driven by tail current IB2. Transistors Q13 and Q14 with load resistors R5 and R6 form the equivalent of amplifier $A_{ii}$ of FIG. 2, with resistors R7 and R8 providing the negative feedback equivalent to that provided by resistors R2 in FIG. 2. Finally, transistors Q15 and Q16 and load resistors R9 and R10 are supplied with tail current IA2 and form the equivalent of amplifier $A_{iii}$ of FIG. 2.

Now referring to FIG. 5, a circuit diagram for variable gain amplifier VGA3 may be seen. This circuit, comprising transistors Q17–Q22 and resistors R11–R18, is a duplication of the circuit for variable gain amplifier VGA2 of FIG. 4, though is driven by a separate set of tail currents G3IBIL, IB3 and IA3. Also, the amplifier is capacitively coupled by capacitors C1 and C2 to the input of the second variable gain amplifier VGA2 (see FIG. 3).

Now referring to FIG. 6, the circuit diagram for the variable gain amplifier VGA1 may be seen. This amplifier, comprising transistors Q23–Q30 and resistors R19–R27, utilizes five tail current sources IA1, IB1, ID1, G1B1IBIL1 and G1B2IBIL2 to control its characteristics. The input differential voltage INPUT+, INPUT− is to be converted into a differential current for input to the translinear current amplifier formed by transistors Q27, Q28, Q31 and Q32. This is accomplished by using two transconductance amplifiers in parallel, one being a fixed transconductance amplifier with a relatively low transconductance gain, and one a variable transconductance amplifier having a maximum transconductance gain λ times that of the fixed transconductance gain amplifier. In the preferred design, a value of λ=5 is used, which results in an adequate trade-off between noise figure and distortion as function of the gain setting.

The fixed transconductance amplifier is formed by the transistors Q27 and Q28, which are also part of the translinear current amplifier, and the loop amplifiers comprising transistors Q23, Q24, Q25 and Q26. The loop amplifiers themselves have a high input impedance. As a consequence, the input impedance of the complete amplifier circuit is 500 ohms, formed in the preferred embodiment by an external resistor REXT in parallel with the two series-connected on-chip resistors R21. Assuming R27=R26 and R23=R22, the fixed transconductance gain is given by:

$$G_{TR_{fixed}} = \frac{2(R22 + R26)}{(R22)(R26)}$$

Since this transfer function is realized through a negative feedback loop, it is linear and adequate to handle large input signals (315 mVp) without excessive distortion. However, due to the relative low-gain of this fixed amplifier, the noise performance for high gain settings is not adequate. For this reason, a second, gain-controlled transconductance stage is connected in parallel with the fixed transconductance. The fixed transconductance gain amplifier is not turned off, but remains always present for all values of gain setting.

In the preferred embodiment, the input amplifier VGA1 needs a 30 dB gain control range. At minimum gain of the input amplifier VGA1, the maximum input signal level will be 315 mVp. The range of 30 dB of the input amplifier is split into two ranges, namely a 14.44 dB of range by controlling the ratio of currents IA1/IB1 and a range of 15.55 dB by controlling the tail current of Id1 from zero to 933 μA (at T=27° C.), giving at maximum gain at the tail current ID1=933 μA of λ=5. In this way, adequate high-signal handling is achieved, combined with an adequate noise match at low input signal levels up to 10 mVp.

Figure 7:
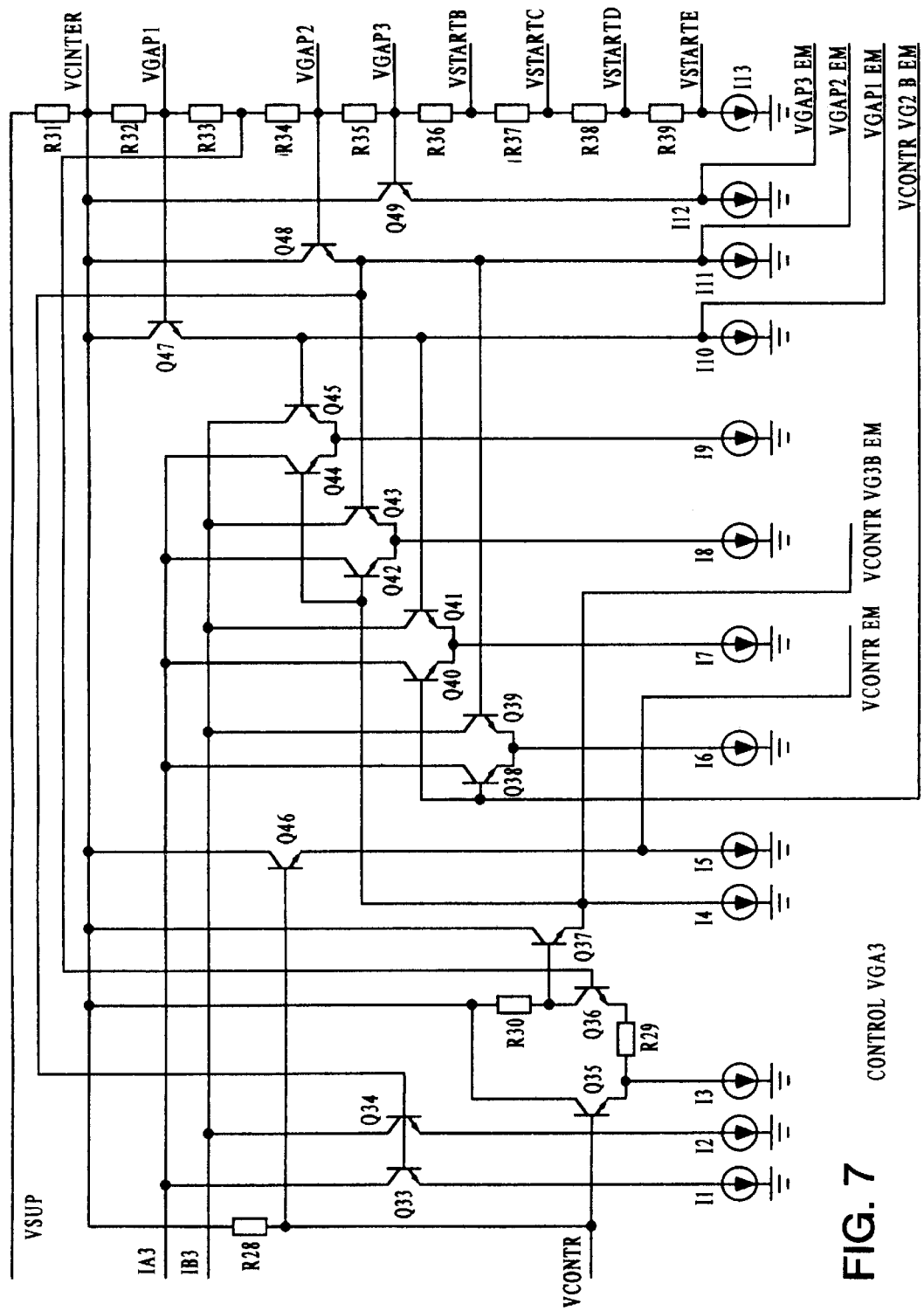
FIG. 7 is a circuit diagram for the exemplary control circuit for the variable gain amplifier VGA3

Now referring to FIG. 7, one of the control circuits for the variable gain amplifiers may be seen. This control circuit, comprised of transistors Q33–Q49, resistors R28–R39 and current sources I1–I13, provides a number of reference voltages and control voltages, and the currents IA3 and IB3, the ratio of which controls the gain for variable gain amplifier VGA3. The inputs to this circuit comprise the power supply voltage VSUP and the gain control voltage VCONTR, the currents IA3 and IB3 being considered an output, even though current is in fact flowing into these connections in a manner determined by the circuit of FIG. 7. The power supply VSUP is applied to a series connection of resistors R31–R39, providing an internal supply voltage VCINTER and a plurality of reference voltages used within the circuit and/or by other control circuits yet to be described. The gain control voltage VCONTR controls the base of transistor Q37 through the combination of transistors Q35 and Q36 and resistors R29 and R30. Transistor Q37, acting as an emitter follower, determines the output voltage VCONTRVG3BEM, as well as the voltage on the bases of transistors Q42 and Q44. When the control voltage VCONTR is low, a sufficient part of current source I3 will flow through resistor R30, transistor Q36 and resistor R29 in comparison to the current through transistor Q35 so that the voltage drop in resistor R30 plus the VBE of transistor Q37 will make the voltage VCONTVG3BEM less than the VBE of transistor Q47 below the voltage VGAP1 and less than the VBE of transistor Q48 below the voltage VGAP2. Thus transistors Q42 and Q44 will be turned off and transistors Q43 and Q45 will be turned on through transistors Q48 and Q47, respectively. This directs current sources I8 and I9 to contribute to the current IB3.

Figure 8:
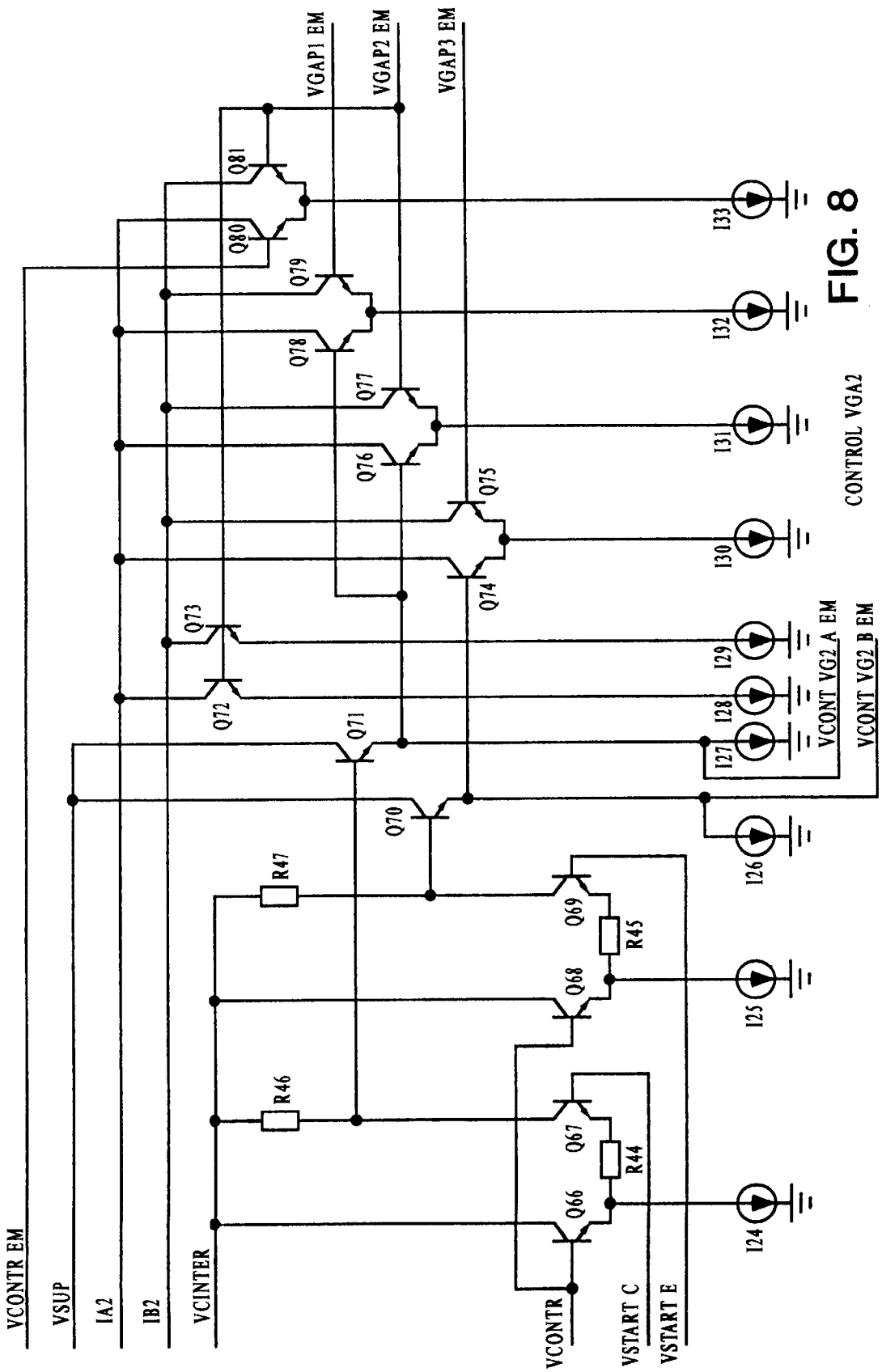
FIG. 8 is an exemplary circuit diagram similar to FIG. 7 for generating the tail currents IA2 and IB2 for the variable gain amplifier VGA2.

The voltage VCONTRVG2BEM controlling the bases of transistors Q38 and Q40 of FIG. 7 is provided by the circuit of FIG. 8. When VCONTR is well below VSTARTE, a sufficient part of current source I25 will flow through resistor R47, transistor Q69 and resistor R45 in comparison to the current through transistor Q68 so that the voltage drop in resistor R47 plus the VBE of transistor Q70 will make the voltage VCONTVG2BEM (FIG. 7) less than the VBE of transistor Q47 below the voltage VGAP1 and less than the VBE of transistor Q48 below the voltage VGAP2. Thus transistors Q38 and Q40 will be turned off and transistors Q39 and Q41 will be turned on through transistors Q48 and Q47, respectively. This directs current sources I6 and I7 to contribute to the current IB3 also, so that the current of current sources I6, I7, I8 and I9 will all contribute to the current IA3. In that regard, the current of current sources I1 and I2 through transistors Q33 and Q34, respectively, determine the minimum values of the currents IA3 and IB3.

The control voltage VCONTR is also applied to the base of transistor Q46, acting as an emitter follower. With the control voltage VCONTR low, current source I5 will pull the emitter of transistor Q46 low so that voltage VCONTREM will also be low. Thus, in summary, with VCONTR low, IA3/IB3 will be at a minimum, setting the gain of the variable gain amplifier VGA3 (FIG. 5) to its lowest gain setting. As VCONTR increases, VCONTRLVG2BEM and VCONTREM will increase. Ultimately, with VCONTRL high, transistors Q38, Q40, Q42 and Q44 will all be turned on and transistors Q39, Q41, Q43 and Q45 will be substantially turned off. This directs the current of current sources I6, I7, I8 and I9 all to contribute to the current IB3, leaving IA3 at a minimum value. By proper selection of the resistors determining VGAP1 and VGAP2 and selection of the resistors determining VCONTRLVG2BEM and VCONTRLVG3BEM relative to VCONTR (resistors R45 and R47 and resistors R29 and R30, respectively), one may obtain a smooth (substantially linear) change in gain ($I_A/I_B$) in dB with control voltage by properly choosing the four values of the control voltage VCONTRL at which a respective one of differential transistor pairs Q38 and Q39, Q40 and Q41, Q42 and Q43, and Q44 and Q45 (FIG. 7) have a zero differential voltage on their bases, as described generally with respect to FIG. 1. Also as pointed out with respect to FIG. 1, the current sources establishing $I_A$ and $I_B$ need not be proportional to temperature. In that regard, the number of VBEs between the control voltage VCONTRL and one of the differential pairs Q38 and Q39, Q40 and Q41, Q42 and Q43, and Q44 and Q45 and between the respective reference voltage and the respective transistor pair is equal, so no temperature drift will result from this source.

The sequence of control of the individual gain states as a function of the control voltage in the preferred embodiment is selected such that the best performance is obtained with respect to noise, signal handling capability and distortion at every setting of the total gain. This implies, that as a function of a decreasing control voltage (or as a function of a decreasing total VGA gain from a maximum gain), first the last amplifier VGA2 is controlled to lower gain values, whereafter the middle amplifier VGA3 is controlled to lower gain values, whereafter the input amplifier VGA1 is controlled to lower gain values, whereafter the last amplifier VGA2 is controlled again to still lower gain values.

Now referring to FIG. 8, a circuit similar to FIG. 7 for generating the tail currents IA2 and IB2 for the variable gain amplifier VGA2 may be seen. This circuit is comprised of transistors Q66–Q81, current sources I24–I33 and resistors R44–R47. This circuit uses as inputs, in addition to the supply voltage VSUP and the internal supply voltage VCINTER, the control voltage VCONTR and the reference voltages VSTARTC and VSTARTE. It also uses as inputs the voltages VCONTREM, VGAP1EM, VGAP2EM and VGAP3EM, these voltages coming from the circuit of FIG. 7. The suffix EM indicates that the respective voltage is one VBE below the same voltage without the EM. By way of example, referring again to FIG. 7, the voltage VCONTREM is lower than the control voltage VCONTR by the VBE of transistor Q46, the voltage VGAP1EM is lower than the reference voltage VGAP1 by the VBE of transistor Q47, etc.

As may be seen in FIG. 8, transistors Q72 and Q73 provide minimum values of tail currents IA2 and IB2 from current sources I28 and I29, with transistor pairs Q74 and Q75, Q76 and Q77, Q78 and Q79, and Q80 and Q81 being controlled by comparisons between the voltages VCONTR and VSTARTC, VCONTR and VSTARTE, and VCONTEM and VGAP2EM to determine what divisions of current of current sources I30–I33 are directed to each of IA2 and IB2 for a given control voltage VCONTR. Finally, the circuit also provides as outputs, the control voltages VCONTVG2AEM and VCONTVG2BEM, the function of which will be subsequently described.

Figure 9:
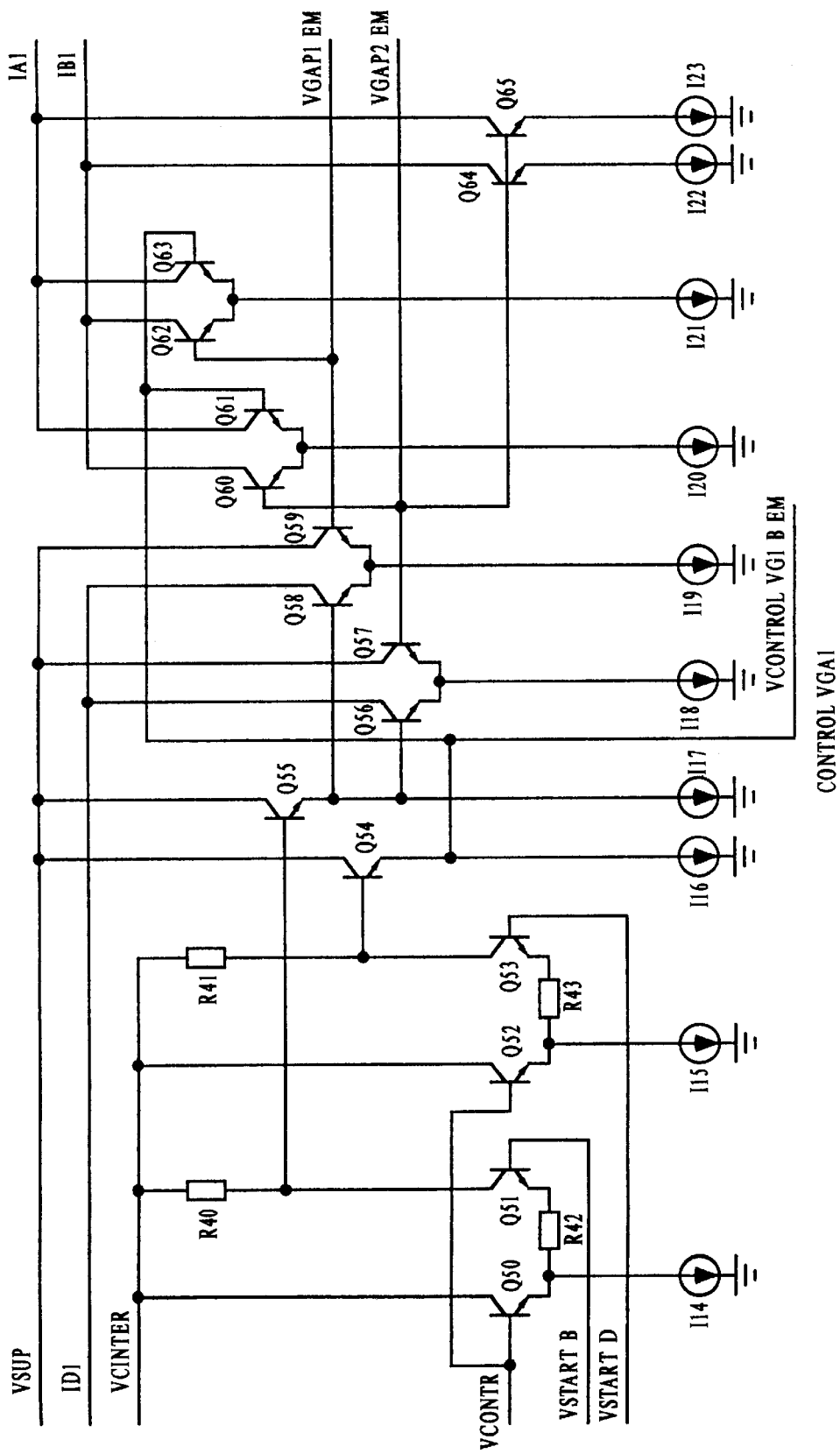
FIG. 9 is an exemplary circuit diagram for generating, among other things, the tail currents IA1 and IB1 for the variable gain amplifier VGA1 of FIG. 6.

Now referring to FIG. 9, a circuit for generating, among other things, the tail currents IA1 and IB1 for the variable gain amplifier VGA1 of FIG. 6 may be seen. In this circuit, transistors Q64 and Q65 determine the minimum values of IA1 and IB1 as the current of current sources I23 and I22. The current sources I20 and I21 contribute to the tail currents IA1 and IB1 as steered by the differential transistor pairs Q60 and Q61, and Q62 and Q63, respectively. These transistors, in turn, are controlled by comparisons between a voltage derived from the voltages VCONTR and VSTARTD through transistors Q52 and Q53, resistors R41 and R43 and transistor Q54, and the voltages VGAP2EM and VGAP1EM, respectively, the latter two voltages being derived from the circuit of FIG. 7.

The circuit of FIG. 9 also has input circuits comprised of transistors Q50 through Q53 and resistors R40 through R43, referenced to voltages VCONTR and VSTARTB to control the bases of transistors Q56 and Q58 through transistor Q55 and Q54 responsive to the control voltage VCONTRL. The voltage on the bases of transistors Q56 and Q58 is compared with VGAP2EM by differential transistor pair Q56 and Q57 and with VGAP1EM by differential transistor pair Q58 and Q59 to determine the steering of current sources I18 and I19 to the tail current ID1, or from the power supply directly to ground. The voltage on the bases of transistors Q61 and Q63 is compared with VGAP2EM by differential transistor pair Q60 and Q61 and with VGAP1EM by differential transistor pair Q62 and Q63 to determine the steering of current sources I20 and I21 to the tail currents IA1 or IB1. Current sources I22 and I23 provide the minimum currents through transistors Q64 and Q65 for IB1 and IA1, respectively.

There are no transistors providing a minimum value for the tail current ID1. As may be seen in FIG. 6, the tail current ID1 is the tail current for differential transistor pair Q29 and Q30, forming the high gain amplifier for the overall variable gain amplifier system of FIG. 3. This high gain input amplifier performs very well for small signal inputs. For lower gain settings, however, where the allowable input signal without saturation may be higher, transistors Q29 and Q30 of FIG. 6 would cause distortion. Accordingly, for the lower control voltages VCONTRL representing lower gain settings, the tail current ID1 is shut off so that the feedback amplifier in parallel therewith will provide the desired low gain, low distortion input stage, the gain of which is controlled by the current ratio IA1/IB1.

Figure 10:
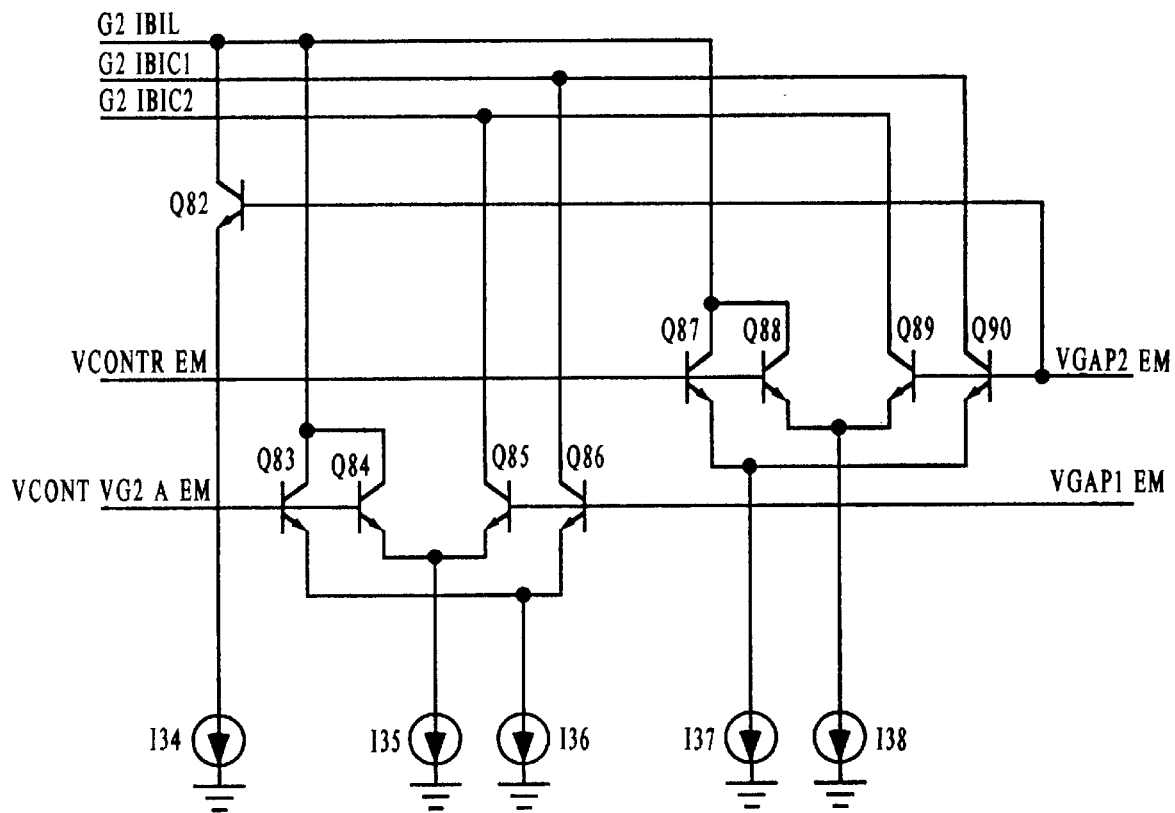
FIG. 10 is an exemplary circuit diagram for the circuit used to generate the tail current G2IBIL for amplifier $A_i$ (FIG. 2) of the variable gain amplifier VGA2 of FIG. 4.

Now referring to FIG. 10, the circuit used to generate the tail current G2IBIL for amplifier $A_i$ (FIG. 2) of the variable gain amplifier VGA2 of FIG. 4 may be seen, this circuit comprising transistors Q82–Q90 and current sources I34–I38. As may be seen in FIG. 4, the tail current G2IBIL nominally flows one-half through resistor R3 and one-half through resistor R4, providing the voltages G2IBIC1 and G2IBIC2, respectively. If the tail current G2IBIL is varied to vary the gain of the equivalent of amplifier $A_i$ of FIG. 2, the voltages G2IBIC1 and G2IBIC2 would vary also. However, if any reduction in the tail current G2IBIL was accompanied by an offsetting increase in current through each of resistors R3 and R4 from another source and equal to one-half of the reduction in the tail current, the voltages G2IBIC1 and G2IBIC2 would remain the same, even though the gain of the amplifier has been reduced. This is the function of the gain compensation circuit shown in FIG. 10. In particular, the current of current source I34 flowing through transistor Q82 provides the minimum tail current G2IBIL for the variable gain amplifier VGA2. Transistors Q83–Q86 compare the voltage VCONTVG2AEM (from the circuit of FIG. 8) with the voltage VGAP1EM (from the circuit of FIG. 7). When the control voltage VCONTR is low, the voltage VCONTVG2AEM will be lower than the voltage VGAP1EM, so that transistors Q83 and Q84 will be turned off and the current of current sources I35 and I36 will be provided through resistors R3 and R4 (FIG. 4) by lines G2IBIC2 and G2IBIC1, respectively. As the control voltage is increased, however, during which time the current IA2 will increase and the current IB2 will decrease, the voltage VCONTVG2AEM (FIG. 10) will increase, shifting the currents of current sources I35 and I36 from being provided directly from resistors R3 and R4 of FIG. 4 to being provided by the tail current G2IBIL. Thus, as the tail current IB2 of variable gain amplifier VGA2 decreases, the tail current G2IBIL will be increased to maintain the product of the gain of the equivalent of amplifier $A_i$ and amplifier $A_{ii}$ of FIG. 2 approximately constant. In that regard, transistors Q87–Q90 provide a further variation in the tail current IB2 through a comparison of the voltage VCONTREM (FIG. 7) and VGAP2EM (also from FIG. 7).

Figure 11:
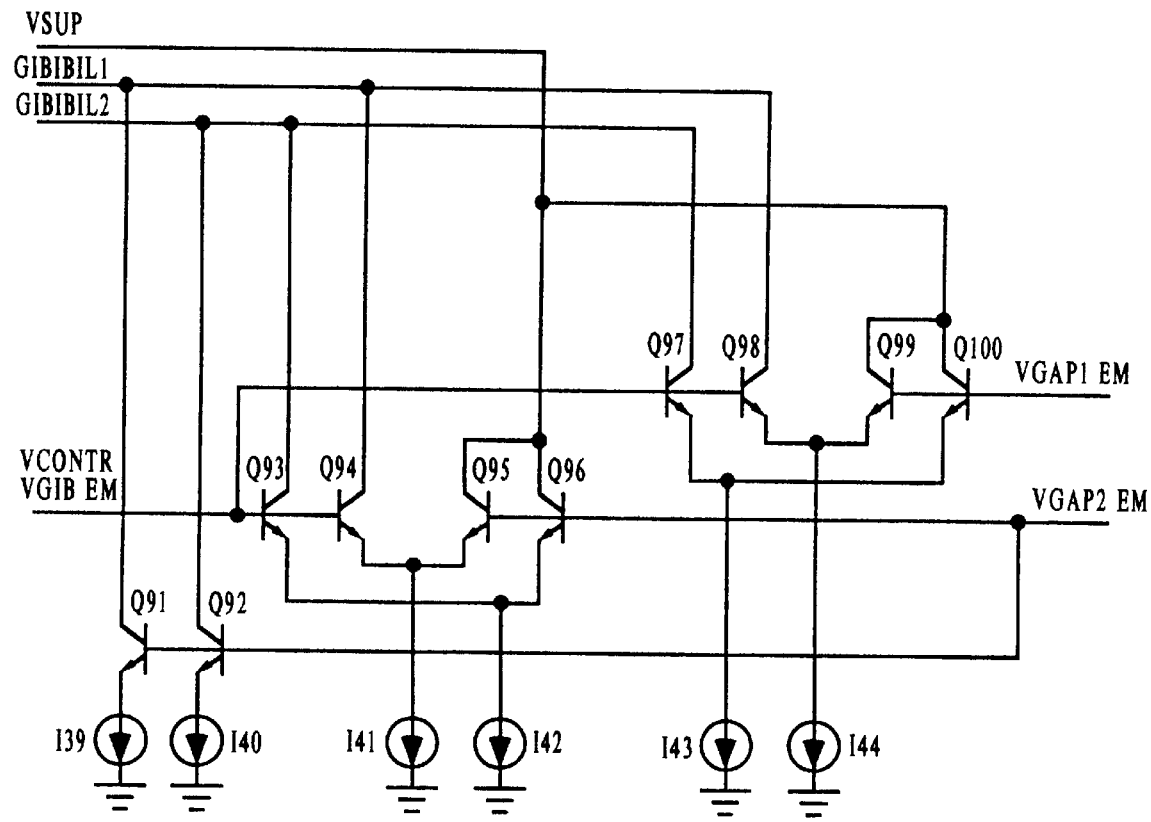
FIG. 11 is an exemplary gain compensation circuit similar to that of FIG. 10, but for the variable gain amplifier VGA1.

FIG. 11 is a gain compensation circuit similar to that of FIG. 10, but for the variable gain amplifier VGA1. In this circuit, transistors Q93–Q100 steer current sources I41–I44 either between the power supply terminals or equally through lines G1BIBIL1 and G1BIBIL2, dependent upon the relative comparisons of the voltage VCONTRVG1BEM (from FIG. 9) with the reference voltages VGAP1EM and VGAP2EM (from FIG. 7). The minimum values of the currents G1BIBIL1 and G1BIBIL2 are provided through transistors Q91 and Q92 by equal current sources I39 and I40.

Figure 12:
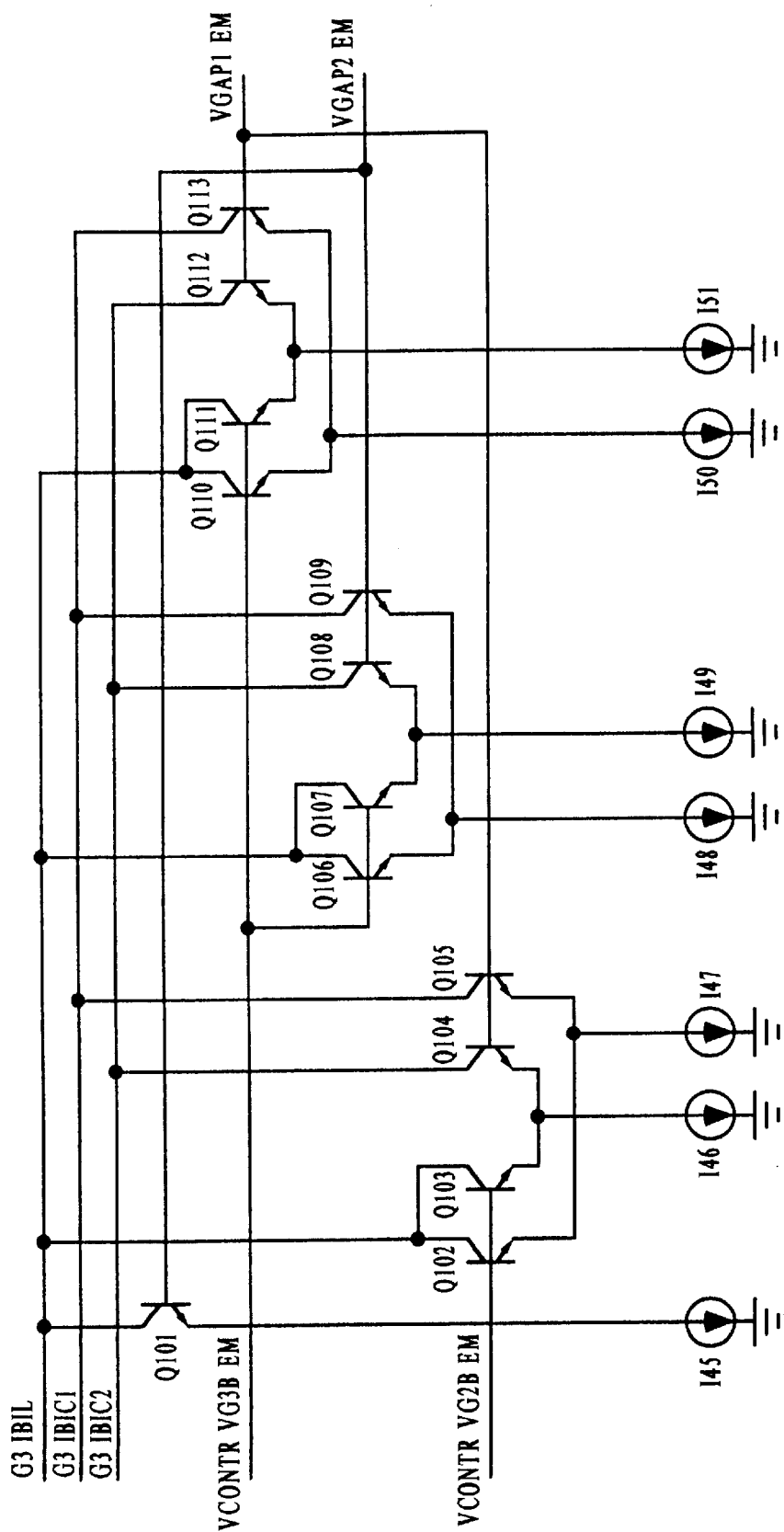
FIG. 12 is an exemplary gain compensation circuit for variable gain amplifier VGA3 (FIG. 5).

A gain compensation circuit for variable gain amplifier VGA3 (FIG. 5) similar to the gain compensation circuit of FIG. 10 may be seen in FIG. 12. This circuit, comprised of current sources I45–I51 and transistors Q102–Q113, provides steering for current sources I46 and I47, I48 and I49, and I50 and I51 between the tail current G3IBIL and the load currents G3IBIC1 and G3IBIC2, respectively, dependent upon relative comparisons between the voltages VCONTRVG3BEM and the voltages VGAP1EM and VGAP2EM, and the relative comparison between the voltages VCONTRVG2BEM and VGAP1EM (all coming from the circuit of FIG. 7).

There has been described herein a variable gain amplifier comprised of multiple variable gain stages, wherein the gain of the various stages is controlled by comparisons of a control voltage with various reference voltages, in the preferred embodiment generated by the use of a series connection of multiple resistors connected to a supply voltage. These relative comparisons control current ratios, determining the gain of each variable gain amplifier stage. By staggering the changes in current ratios, an overall gain change with control voltage which is a smooth in gain in dB versus control voltage in volts may be achieved, generally without requiring use of current sources which are proportional to absolute temperature.

While the present invention has been disclosed and described with respect to a preferred embodiment thereof, it will be understood by those skilled in the art that various changes in form and detail may be made therein without departing from the spirit and scope of the invention.

What is claimed is:

1. A variable gain amplifier comprising:
   a plurality of cascaded amplifier stages, each having an input and an output, the input of the first of the cascaded amplifier stages forming the input to the variable gain amplifier and the output of the last of the cascaded amplifier stages forming the output of the variable gain amplifier, each amplifier stage having:
   first, second and third amplifier elements, each amplifier element having a gain which is dependent on a first, second and third tail current supplied thereto, respectively, the first and second amplifier elements being cascaded and including negative feedback from the output of the second amplifier element to the input of the first amplifier element, the output of the first amplifier element being coupled to the input of the third amplifier element, the output of the third amplifier element forming the output of the amplifier stage;
   a reference generating circuit generating a plurality of reference voltages;
   a tail current generating circuit for each amplifier element of each amplifier stage, each tail current generating circuit generating the second and third tail currents for the respective amplifier element in a ratio responsive to a comparison of a gain control voltage and the reference voltages; and,
   a loop gain control circuit for each amplifier stage, each loop gain control circuit generating the first tail current for the respective amplifier element to maintain the product of the gains of the first and second amplifier elements approximately constant.

2. The variable gain amplifier of claim 1 wherein the tail currents for the first, second and third amplifier elements of each amplifier stage are not proportional to absolute temperature.

3. The variable gain amplifier of claim 1 wherein the reference generating circuit comprises a series connection of resistors powered by a reference voltage.

4. A variable gain amplifier comprising:
   a plurality of cascaded amplifier stages, each having a differential input and a differential output, the differential input of the first of the cascaded amplifier stages forming the input to the variable gain amplifier and the output of the last of the cascaded amplifier stages forming the output of the variable gain amplifier, each amplifier stage having:
   first, second and third differential amplifier elements, each amplifier element having a differential pair of transistors having a gain which is dependent on a first, second and third tail current supplied thereto, respectively, the first and second amplifier elements being cascaded and including negative feedback from the differential output of the second amplifier element to the differential input of the first amplifier element, the differential output of the first amplifier element being coupled to the differential input of the third amplifier element, the differential output of the third amplifier element forming the differential output of the amplifier stage;
   a reference generating circuit generating a plurality of reference voltages;
   a tail current generating circuit for each amplifier element of each amplifier stage, each tail current generating circuit generating the second and third tail currents for the respective amplifier element in a ratio responsive to a comparison of a gain control voltage and the reference voltages; and,
   a loop gain control circuit for each amplifier stage, each loop gain control circuit generating the first tail current for the respective amplifier element to maintain the product of the gains of the first and second amplifier elements approximately constant.

5. The variable gain amplifier of claim 4 wherein the tail currents for the first, second and third amplifier elements of each amplifier stage are not proportional to absolute temperature.

6. The variable gain amplifier of claim 4 wherein the reference generating circuit comprises a series connection of resistors powered by a reference voltage.

7. The variable gain amplifier of claim 6 wherein the tail current generating circuits for the second and third amplifier elements of each amplifier stage includes a plurality of differential transistor pairs, each transistor pair being responsive to a comparison of a respective reference voltage from the reference generating circuit with a voltage responsive to the gain control voltage to steer a current from a respective current source to provide a component of the second and third tail currents in a proportion responsive to the comparison.

8. The variable gain amplifier of claim 7 wherein the tail current generating circuits for the first amplifier elements of each amplifier stage comprises a plurality of differential transistor pairs, each transistor pair being responsive to a comparison of a respective reference voltage from the reference generating circuit with a voltage responsive to the gain control voltage to steer a part of a current from a respective current source to provide a component of the first tail current in a fraction responsive to the comparison.

9. The variable gain amplifier of claim 7 wherein the transistors are bipolar transistors.

* * * * *